United States Patent
Yen

(10) Patent No.: US 7,330,380 B2
(45) Date of Patent: Feb. 12, 2008

(54) DIGITAL-TO-ANALOG CONVERSION DEVICE

(75) Inventor: Chih-Jen Yen, Hsinchu (TW)

(73) Assignee: Novatek Microelectronics Corp., Hsinchu (TW)

(*) Notice: Subject to any disclaimer, the term of this patent is extended or adjusted under 35 U.S.C. 154(b) by 273 days.

(21) Appl. No.: 11/271,425

(22) Filed: Nov. 9, 2005

(65) Prior Publication Data

US 2007/0064502 A1    Mar. 22, 2007

(30) Foreign Application Priority Data

Sep. 16, 2005    (TW) .............................. 94131987 A

(51) Int. Cl.
G11C 11/34    (2006.01)

(52) U.S. Cl. ................. 365/189.05; 365/191; 365/194; 365/189.06; 365/189.12

(58) Field of Classification Search ........... 365/189.05, 365/189.06, 189.12, 191, 194
See application file for complete search history.

(56) References Cited

U.S. PATENT DOCUMENTS 6,115,285 A * 9/2000 Montanari et al. ...... 365/185.03
7,254,071 B2 * 8/2007 Tu et al. ..................... 365/201

* cited by examiner

*Primary Examiner*—Pho M. Luu
(74) *Attorney, Agent, or Firm*—J.C. Patents

(57) ABSTRACT

A digital-to-analog (D/A) conversion device including a data-latch unit, a D/A conversion unit and a gain amplifier is provided. Wherein, the amplitude of the supply voltages for the reference voltage of the D/A conversion unit is not greater than that of the data-latch unit so that the switches in a switch control unit of the D/A conversion unit can be fully turned on or off without using level-shift units. The output amplifier must have a gain to amplify the output signal of the D/A conversion unit to an expected voltage range.

15 Claims, 6 Drawing Sheets

DIGITAL-TO-ANALOG CONVERSION DEVICE

CROSS-REFERENCE TO RELATED APPLICATION

This application claims the priority benefit of Taiwan application Ser. No. 94131987, filed on Sep. 16, 2005. All disclosure of the Taiwan application is incorporated herein by reference.

BACKGROUND OF THE INVENTION

1. Field of Invention

The present invention relates to a digital-to-analog (D/A) conversion device. More specifically, the present invention relates to a D/A conversion device without using level-shift units.

2. Description of Related Art

A digital-to-analog (D/A) converter is usually used in converting digital input data into analog output data. FIG. 1 is a schematic block diagram illustrating a conventional D/A converter. With reference to FIG. 1, the D/A converter includes a data-latch unit 101, a D/A conversion unit 104, level-shift units 108 and 109, switches S1 and S2 and a unity-gain amplifier 107. The data-latch unit 101 includes a first data-latch 102 and a second data-latch 103. The D/A conversion unit 104 includes a reference voltage supply 105 and a switch control unit 106.

FIG. 1A is a schematic timing sequence chart describing the non-overlap clock signals CK1 and CK2 used in FIG. 1. With reference to FIG. 1 and FIG. 1A, during phase 1 (i.e. when clock signal CK1 is in a high level phase), a digital input data (Din) is read into the data-latch 102, and a previous digital input data is still latched in the data-latch 103. At this moment, the switch S2 is controlled by the clock signal CK1 and is turned on. Therefore, the previous digital input data, which was latched in the data-latch 103 earlier, is sent to the switch control unit 106 via the level-shift unit 109 and the switch S2 so as to perform D/A conversion. The corresponding analog voltage (from the reference voltage supply 105) will be sent to the unity-gain amplifier 107 to serve as the analog output data Aout.

During phase 2 (i.e. when the clock signal CK2 is in a high level phase), a next digital input data (Din) will be read into the data-latch 103, and the digital data inputted during phase 1 is still latched in the data-latch 102. At this time, the switch S1 is controlled by the clock signal CK2 and is turned on. Therefore, the digital input data, which was input during phase 1 and was latched in the data-latch 102, is sent to the switch control unit 106 via the level-shift unit 108 and the switch S1 in order to perform D/A conversion. The corresponding analog voltage (from the reference voltage supply 105) will be sent to the unity-gain amplifier 107 to acquire another analog output data Aout.

The data-latches 102 and 103 both operate on a first voltage VDD1 and a second voltage VSS1. The reference voltage supply 105 operates on a third voltage VDD2 and a fourth voltage VSS2 to provide a plurality of reference voltages for D/A conversion. The level-shift units 108 and 109 are used to increase the voltage level of the digital input data, so that the switches in the switch control unit 106 can be fully turned on. The unity-gain amplifier 107 coupled to a fifth voltage VDD3 and a sixth voltage VSS3 is used to increase the driving ability to output load. For the data-latch unit 101, the conventional voltage VDD1 and VSS1 are always within the range of a small voltage amplitude, and the voltage amplitude is less than the voltages VDD2 and VSS2 (also is less than voltages VDD3 and VSS3). Therefore, the conventional technology has to increase the voltage level of the input data through the level-shift unit. The level-shift unit 108 and the level-shift unit 109 operate at the voltage amplitude of voltages VDD4 and VSS4 (must be not less than the voltage amplitude of voltages VDD2 and VSS2), so that the switches of the switch control unit 106 can be fully turned on or turned off.

FIG. 2 is a schematic block diagram of another conventional D/A converter. With reference to FIG. 2, a data-latch unit 201, a D/A conversion unit 204 and a unity-gain amplifier 207 are included. The data-latch unit 201 includes a first data-latch 202 and a second data-latch 203. The D/A conversion unit 204 includes a reference voltage supply 205 and a switch control unit 206. The timing sequence of the clock signals CK1 and CK2 can be referred to FIG. 1A. When the clock signal CK1 is in a high level, a digital input data (Din) is read into the first data-latch 202, and the previous digital input data is still latched in the second data-latch 203 and is constantly sent to the level-shift unit 208. When the clock signal CK2 is in a high level, the digital input data (Din) is latched in the first data latch 202 and is read into the second data-latch 203 at the same time. The previous digital input data originally latched in the second data latch 203 is then updated and is sent to the level-shift unit 208 at the same time. Since the latched data outputted by the second data-latch 203 operates between the voltages VDD1 and VSS1, which are not enough to drive the switches in the switch control unit 206. Therefore, the level-shift unit 208 converts the digital input data into a higher voltage level, so as to fully turn on or turn off the switches in the switch control unit 206. The D/A conversion unit 204 generates an analog voltage according to the reference voltage supply 205 and the digital code outputted by the level-shift unit 208. Then, the corresponding analog voltage (from the reference voltage supply 205) is sent to the unity-gain amplifier 207 to serve as the analog output data Aout. The unity-gain amplifier 207 is used to increase the driving ability to the output load.

Next, when the clock signal CK1 becomes the high level again, the next new digital input data is read into the data-latch 202, and the previous digital input data is still latched in the second data-latch 203 and is sent to the level-shift unit 208. When the clock signal CK2 becomes the high level again, the next new digital input data is still latched in the first data-latch 202 and is sent to the second data-latch 203 and the level-shift unit 208. And the previous digital input data stored in the data-latch 203 is updated accordingly. Therefore, the D/A conversion unit 204 then outputs a next new analog voltage. Lastly, the new analog voltage is outputted by the unity-gain amplifier 207.

As show in FIG. 2, the data-latches 202 and 203 operate at the voltage VDD1 and voltage VSS1. The reference voltage supply 205 operates at the voltage VDD2 and voltage VSS2. The unity-gain amplifier 207 operates at the voltage VDD3 and voltage VSS3, and the level-shift unit 208 operates at the voltage VDD4 and voltage VSS4. The operation principle of the D/A converter is similar to what is described in FIG. 1. The main difference between FIG. 1 and FIG. 2 is that the data-latches 202 and 203 in the data-latch unit 201 in FIG. 2 are serially connected; therefore, only one level-shift unit 208 is required.

FIG. 3 schematically describes another conventional D/A conversion device. With reference to FIG. 3, the D/A conversion device has multiple channels, wherein each of the channels is equipped with a D/A converter (i.e. DAC1~DACm), and only a reference voltage supply is used.

Take the m$^{th}$ D/A converter (DACm) as the example, a data-latch unit 301, a level-shift unit 309, a D/A conversion unit 305 and a unity-gain amplifier 308 are included. The data-latch unit 301 includes a shift register 302, a first data-latch 303 and a second data latch 304. The D/A conversion unit 305 includes a reference voltage supply 306 and a switch control unit 307. The second control signal CT2 is used to control the data-latch 304, and the first clock signal CK1 and the first control signal CT1 are used to activate the shift register 302.

FIG. 3A schematically illustrates the timing sequence relations of the signals in FIG. 3. Refer to FIG. 3 and FIG. 3A, the shift registers of the D/A converters DAC1~DACm sequentially transmit the first control signal CT1 according to the timing sequence of the first clock signal CK1. Whenever the first control signal CT1 is detected as the high level through the first clock signal CK1 in the high level, the shift register 302 outputs a first enabling signal to the first data-latch 303. Therefore, the first digital input data Din is then received and latched in the first data-latch 303. In other words, in the D/A converters DAC1~DACm, the shift registers output a series of enabling signals to the first data-latches according to the clock signal CK1; and a series of digital input data Dins is received and latched in the first data-latches in sequence. When the serially connected digital input data Dins is completely received and latched in the first data-latches, the second control signal CT2 is then transformed into the high level. Whenever the second control signal CT2 is detected as the high level through the first clock signal CK1 in the high level, the data latched in the first data-latch (for example, 303) is then sent to and latched in the second data-latch (for example, 304). The level-shift units (for example 309) transform the digital input data into higher voltage level, so as to turn on/off the switches in the switch control units (for example, 307). The switch control units select the corresponding reference voltages outputted by the reference voltage supply 306 according to the digital codes outputted by the level-shift units, so as to generate analog voltages. The unity-gain amplifier (for example, 308) is used to increase the driving ability to the output load.

Next, the first control signal CT1 is transformed again and is detected by the first clock signal CK1 when the first control signal CT1 is in the high level, accordingly, the data in the first data-latches is updated and latched. Then, the above described data-latching operation is repeated. The principle of the D/A conversion operation is similar to the descriptions of FIG. 1 and FIG. 2. The main difference is that the device in FIG. 3 can latch a plurality of digital input data in the first data-latches and the first data-latch 303 latches the digital input data Din according to the command of the shift register 302. As shown in FIG. 3, the data-latches 302, 303 and the shift register 301 operate at the voltage VDD1 and the voltage VSS1, while the reference voltage 306 operates at the voltage VDD2 and voltage VSS2. The unity-gain amplifier 308 operates at the voltage VDD3 and voltage VSS3, and the level-shift unit 309 operates at the voltage VDD4 and the voltage VSS4.

In the conventional technology as shown in FIG. 1, FIG. 2 and FIG. 3, since the voltages VDD1<VDD2≦VDD4≦VDD3, and the voltages VSS3≦VSS4≦VSS2≦VSS1, therefore, the conventional technology needs the level-shift units to increase the voltage level of the digital input data, so as to fully turn on/turn off the switches in the switch control units to complete the D/A conversion.

SUMMARY OF THE INVENTION

The object of the present invention is to provide a digital-to-analog (D/A) conversion device which can complete the D/A conversion without using level-shift units.

Based on the above and other objects, the present invention provides a D/A conversion device to convert a digital input data into an analog output data. The D/A conversion device includes a data-latch unit, a first switch, a second switch, a D/A conversion unit and a gain amplifier. The data-latch unit has an input terminal, a first output terminal and a second output terminal. The data-latch unit receives the digital input data from the input terminal; and the digital input data is latched and the latched data is outputted from the first output terminal during the second period. And during the first period, the digital input data is latched and the latched data is outputted from the second output terminal. The first terminal of the first switch is coupled to the first output terminal of the data-latch unit, so that the first terminal and the second terminal of the first switch are disconnected during the first period, and the first terminal and the second terminal are connected during the second period so as to transmit the latched data to the second terminal of the first switch. The first terminal of the second switch is coupled to the second output terminal of the data-latch unit, so that the first terminal and the second terminal of the second switch are disconnected during the second period, and the first terminal and the second terminal are connected during the first period to transmit the latched data to the second terminal of the second switch. The input terminal of the D/A conversion unit is coupled to the second terminals of the first switch and the second switch, so as to convert the latched data outputted by the data latch unit and output the corresponding analog voltage. The input terminal of the gain amplifier is coupled to the output terminal of the D/A conversion unit to amplify the analog voltage and to generate the analog output data from the output terminal of the gain amplifier. Wherein, the level of the analog output data is between the fifth voltage and the sixth voltage.

From another point of view, the present invention provides a D/A conversion device to convert a digital input data into an analog output data. The D/A conversion device includes a data-latch unit, a D/A conversion unit and a gain amplifier. The data-latch unit has an input terminal and an output terminal. The data-latch unit receives and latches the digital input data at the input terminal, so as to output the second latched data from the output terminal. The input terminal of the D/A conversion unit is coupled to the output terminal of the data-latch unit to convert the second latched data outputted by the data latch unit and output the corresponding analog voltage. The input terminal of the gain amplifier is coupled to the output terminal of the D/A conversion unit to amplify the analog voltage and to generate the analog output data from the output terminal of the gain amplifier. Wherein, the level of the analog output data is between the fifth voltage and the sixth voltage.

The present invention further provides a D/A conversion device to convert a digital input data into an analog output data. The D/A conversion device includes a shift register, a data-latch unit, a D/A conversion unit and a gain amplifier. The shift register shifts the received first control signal and output at least one shifted control signal according to the first clock signal. The data-latch unit receives and latch the digital input data from the input terminal according to the level-shifted control signal, and output the second latched data from the output terminal according to a second control signal. The input terminal of the D/A conversion unit is coupled to the output terminal of the data-latch unit to convert the second latched data outputted by the data latch unit and output the corresponding analog voltage. The input terminal of the gain amplifier is coupled to the output terminal of the D/A conversion unit to amplify the analog voltage and generate the analog output data from the output terminal of the gain amplifier. Wherein, the level of the analog output data is between the fifth voltage and the sixth voltage.

Since the present invention makes the operating voltage of the D/A conversion unit not greater than the operating voltage of the data-latch unit, therefore, the output of the data-latch unit can fully drive the D/A conversion unit without using the level-shift circuit. Next, using the signal gain function of the gain amplifier, an analog output data with enough level can be provided to the output load. Thus, the present invention can save the circuit cost of the level-shift circuit.

In order to the make the aforementioned and other objects, features and advantages of the present invention comprehensible, a preferred embodiment accompanied with figures is described in detail below.

BRIEF DESCRIPTION OF THE EMBODIMENT

Figure 4:
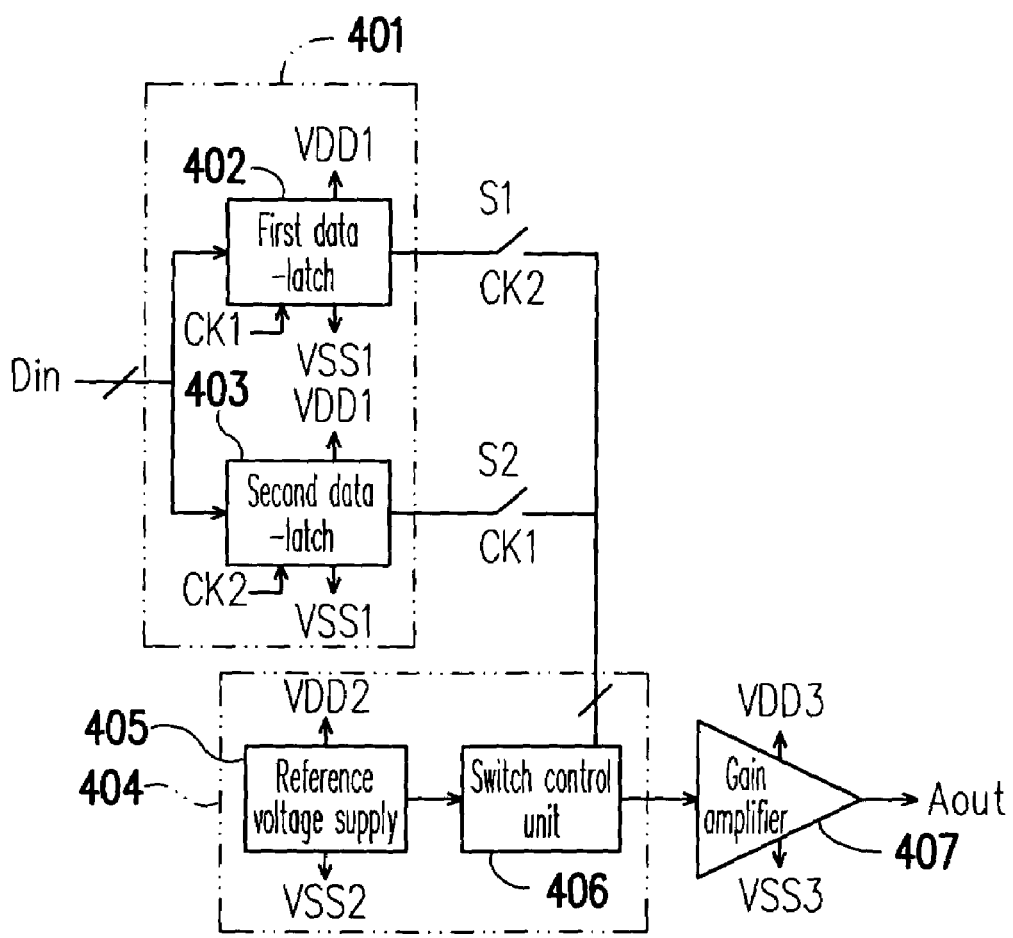
FIG. 4 is an embodiment describing a D/A conversion device according to the present invention.

FIG. 4 is an embodiment describing a D/A conversion device according to the present invention. With reference to FIG. 4, the D/A conversion device converts the digital input data Din into an analog output data Aout. The D/A conversion device includes the data-latch unit 401, the first switch S1, the second switch S2, the D/A conversion unit 404 and the gain amplifier 407. The input terminal of the data-latch unit 401 receives the digital input data Din, so as to latch the digital input data Din and output the latched data to the first switch S1 from the first output terminal during the second period; and latch the digital input data Din and output the latched data to the second switch S2 from the second output terminal during the first period. The first switch S1 is turned off while the second switch S2 is turned on during the first period; and the first switch S1 is turned on while the second switch S2 is turned off during the second period. The input terminal of the D/A conversion unit 404 is coupled to the second terminals of the first switch S1 and the second switch S2, so as to convert the latched data outputted by the data-latch unit 401 and output the corresponding analog voltage to the gain amplifier 407. The gain amplifier 407 is used to amplify the analog voltage outputted by the D/A conversion unit 404, and output the analog output data Aout. Wherein, the level of the analog output data Aout is between the fifth voltage VDD3 and the sixth voltage VSS3.

The above data-latch unit 401 includes the first data-latch 402 and the second data-latch 403. The first terminals of the first data-latch 402 and the second data-latch 403 respectively receive the digital input data Din during the first period and the second period, and latch and output the digital input data to the first switch S1 and the second switch S2 respectively during the second period and the first period. Wherein, the level of the latched data outputted by the first data-latch 402 and the second data-latch 403 is between the first voltage VDD1 and the second voltage VSS1. In the present embodiment, the timing sequence relation between the first period and the second period can be implemented referring to FIG. 1A. During the first period (i.e. when the clock signal CK1 is at a high level), the digital input data Din is read into the first data-latch 402, and at this time, the second switch S2 controlled by the clock signal CK1 is turned on. Therefore, the digital data previously latched in the second data-latch 403 is sent to the D/A conversion unit 404 through the second switch S2 in order to be D/A converted. During the second period (i.e. when the clock signal CK2 is at a high level), the next digital input data Din will be read into the second data-latch 403, and at this time, the first switch S1 controlled by the clock signal CK2 is turned on. The last digital input data which was previously read in is still latched in the first data-latch 402, and is sent to the D/A conversion unit 404 through the first switch S1 in order to be D/A converted during the second period.

The above D/A conversion unit 404 includes the reference voltage supply 405 and the switch control unit 406. The reference voltage supply 405 provides a plurality of reference voltages (the level is between the third voltage VDD2 and the fourth voltage VSS2) for the switch control unit 406. The switch control unit 406 selects one of the corresponding reference voltages (from the reference voltage supply 405) according to the latched data received from the first switch S1 and the second switch S2, and reference voltage is selected as the analog voltage and outputted to the gain amplifier 407. The gain amplifier 407 (the gain value is greater than 1) gain-amplifies the analog voltage output by the D/A conversion unit 404 to output the Aout as the analog output data.

Figure 1:
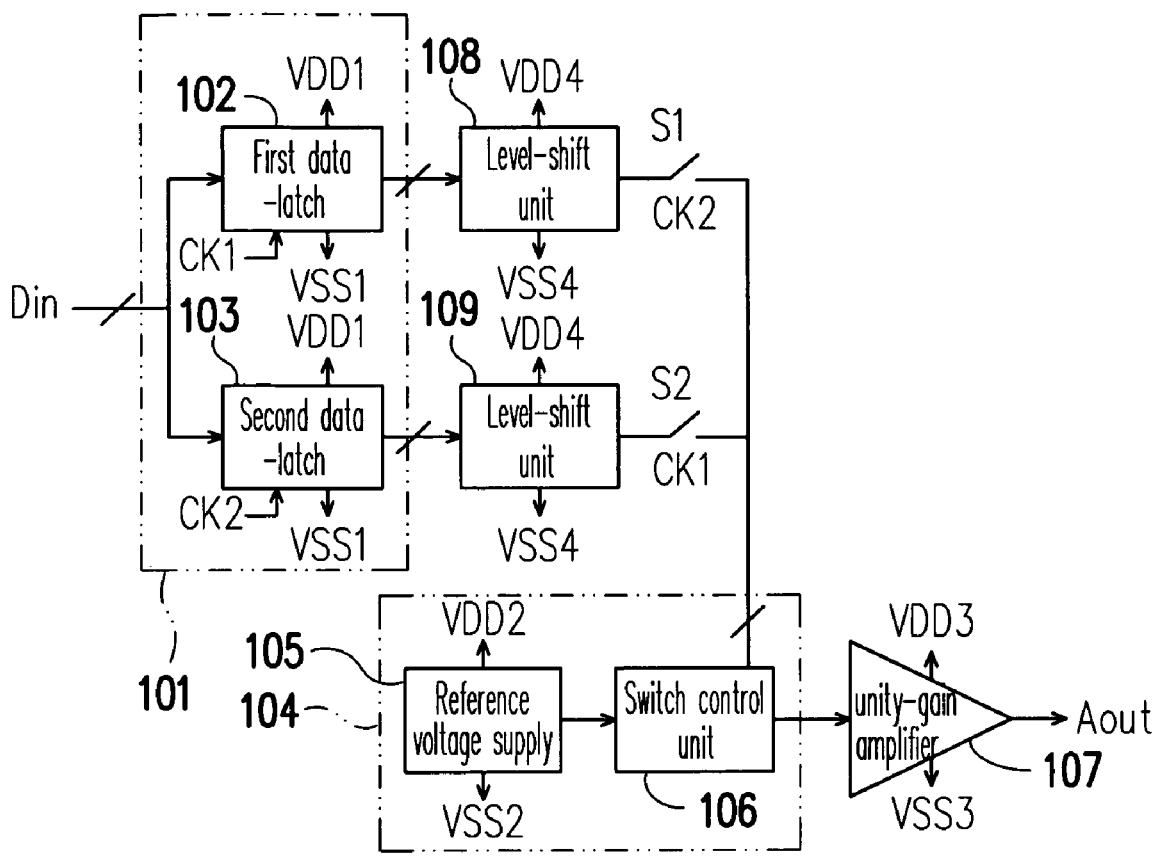
FIG. 1 is a schematic block diagram illustrating a conventional D/A converter.
Figure 1A:
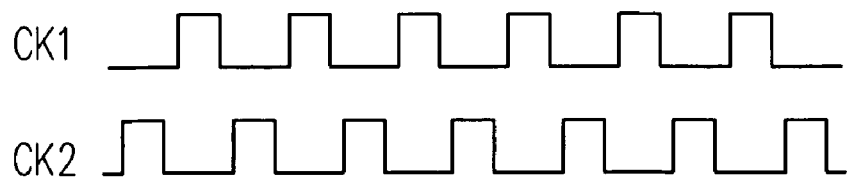
FIG. 1A is a schematic timing sequence chart describing the non-overlap clock signals used in FIG. 1.
Figure 2:
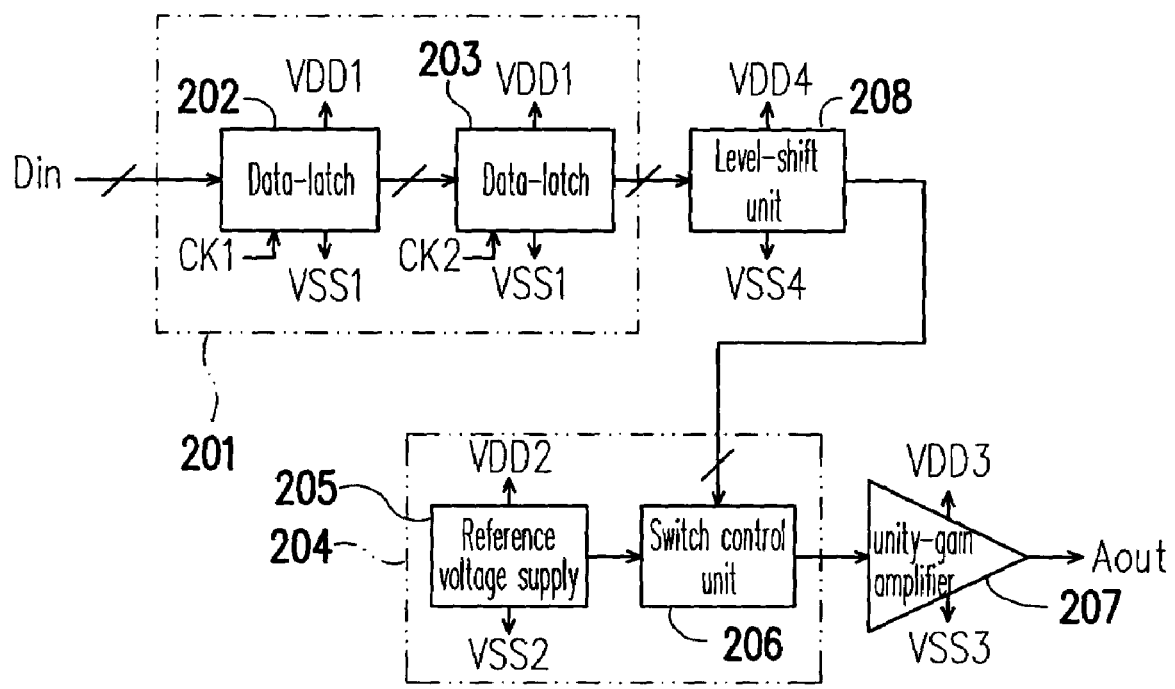
FIG. 2 is a schematic block diagram of another conventional D/A converter.

Based on the spirit of the present invention, the voltage amplitudes of the voltage VDD2 and VSS2 for the reference voltage supply 405 are not greater than the voltage amplitudes of the voltage VDD1 and VSS1 required by the data-latch unit 401, so that the switches in the switch control unit 406 can be fully turned on or turned off. Therefore, the level-shift units 108 and 109 in FIG. 1 are not needed. In order to achieve the normal analog output voltage range to meet the requirement of the output load, the gain amplifier 407 must be able to amplify the output signal of the D/A conversion unit 404. As shown in FIG. 4, the voltage gain of the gain amplifier 407 is set as (VDD−VSS)/(VDD2−VSS2), wherein the VDD and VSS are the analog output voltage ranges of the anticipated output, i.e. (VDD−VSS)≦(VDD3−VSS3).

In the present embodiment, the third voltage VDD2≦the first voltage VDD1≦the fifth voltage VDD3. In addition, the sixth voltage VSS3≦the second voltage VSS1≦the fourth voltage VSS2.

One of the differences between the present embodiment and the conventional technology is that the level-shift units can be omitted in the present embodiment. Moreover, in the present embodiment, the gain of the gain amplifier 407 is not unity-gain, that is, the gain of the amplifier 407 in the present embodiment is greater than 1. As a result, the present invention does not need the level-shift units, thus the system cost can be reduced.

Figure 5:
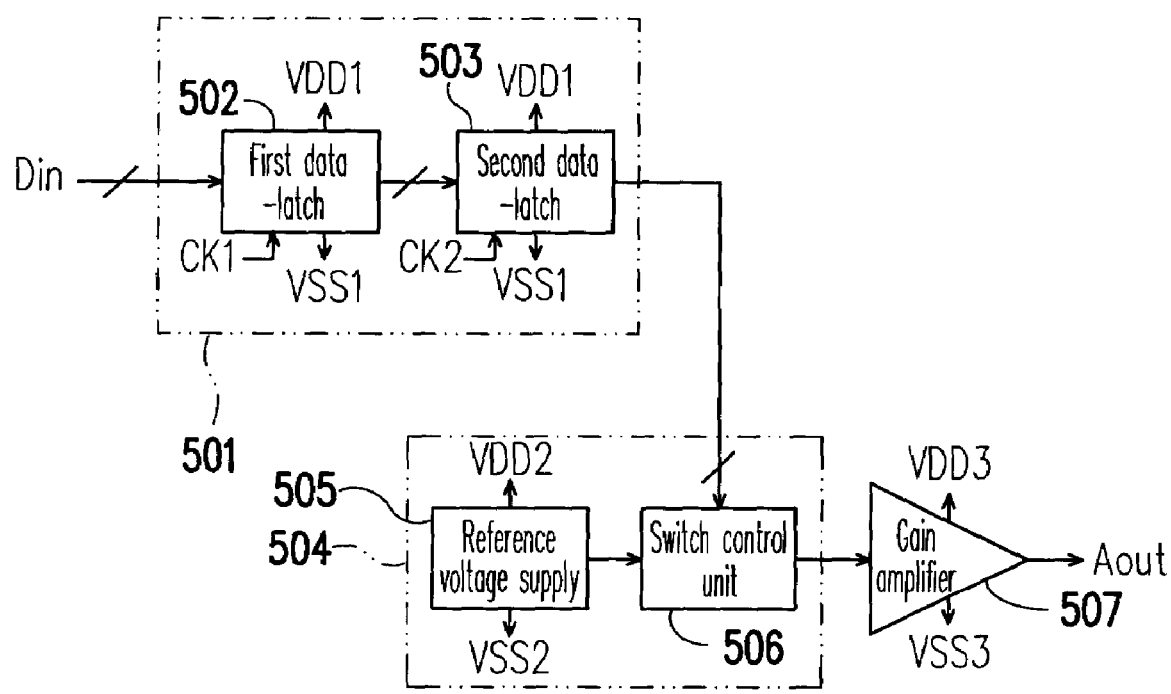
FIG. 5 is another embodiment describing a D/A conversion device according to the present invention.

According to the spirit of the present invention, the ways of implementation are not limited to the above embodiments. FIG. 5 is another embodiment illustrating a D/A conversion device according to the present invention. With reference to FIG. 5, the data-latch unit 501, the D/A conversion unit 504 and the gain amplifier 507 are included. The data-latch unit 501 includes the first data-latch 502 and the second data-latch 503. The D/A conversion unit 504 includes the reference voltage supply 505 and the switch control unit 506.

The first data-latch 502 and the second data-latch 503 latch the data respectively according to the second clock signal CK2 and the first clock signal CK1. In the present embodiment, the timing sequence relation between the first clock signal CK1 and the second clock signal CK2 can be implemented referring to FIG. 1A. During the first period (i.e. when the clock signal CK1 is at a high level), the digital input data Din is read into the first data-latch 502. During the second period (i.e. when the second clock signal CK2 is at a high level), the digital input data is latched in the first data-latch 502, and at the same time, the digital input data is constantly sent to the second data-latch 503 and the switch control unit 506. The switch control unit 506 selects one of the corresponding reference voltages outputted from the reference voltage supply 505 according to the data outputted from the second data-latch 503, and outputs the selected analog reference voltage to the gain amplifier 507.

Next, when the first clock signal CK1 becomes the high level again, the next new digital input data Din is read into the first data-latch 502, and the last digital input data is still latched in the second data-latch 503. At this time, the D/A conversion unit 504 constantly outputs the previous analog voltage to the gain amplifier 507 according to the previous digital input latched data output by the second data-latch 503. When the second clock signal CK2 becomes the high level again, the digital input data is still latched in the first data-latch 502, and meanwhile the data stored in the second data-latch 503 is therefore updated and is sent to the D/A conversion unit 504. Therefore, the D/A conversion unit 504 outputs a next new analog voltage accordingly. Lastly, the gain amplifier 507 outputs the new analog output data Aout.

As shown in FIG. 5, the data-latch 502 and 503 operate at the first voltage VDD1 and the second voltage VSS1; the reference voltage supply 505 operates at the third voltage VDD2 and the fourth voltage VSS2 while the gain amplifier 507 operates at the fifth voltage VDD3 and the sixth voltage VSS3. During the converting operation, since the third voltage VDD2≦the first voltage VDD1≦the fifth voltage VDD3, and the sixth voltage VSS3≦the second voltage VSS1≦the fourth voltage VSS2, therefore, the level-shifter is not required. Consequently, the D/A conversion device of FIG. 5 needs the gain amplifier 507 to achieve a voltage gain.

Figure 6:
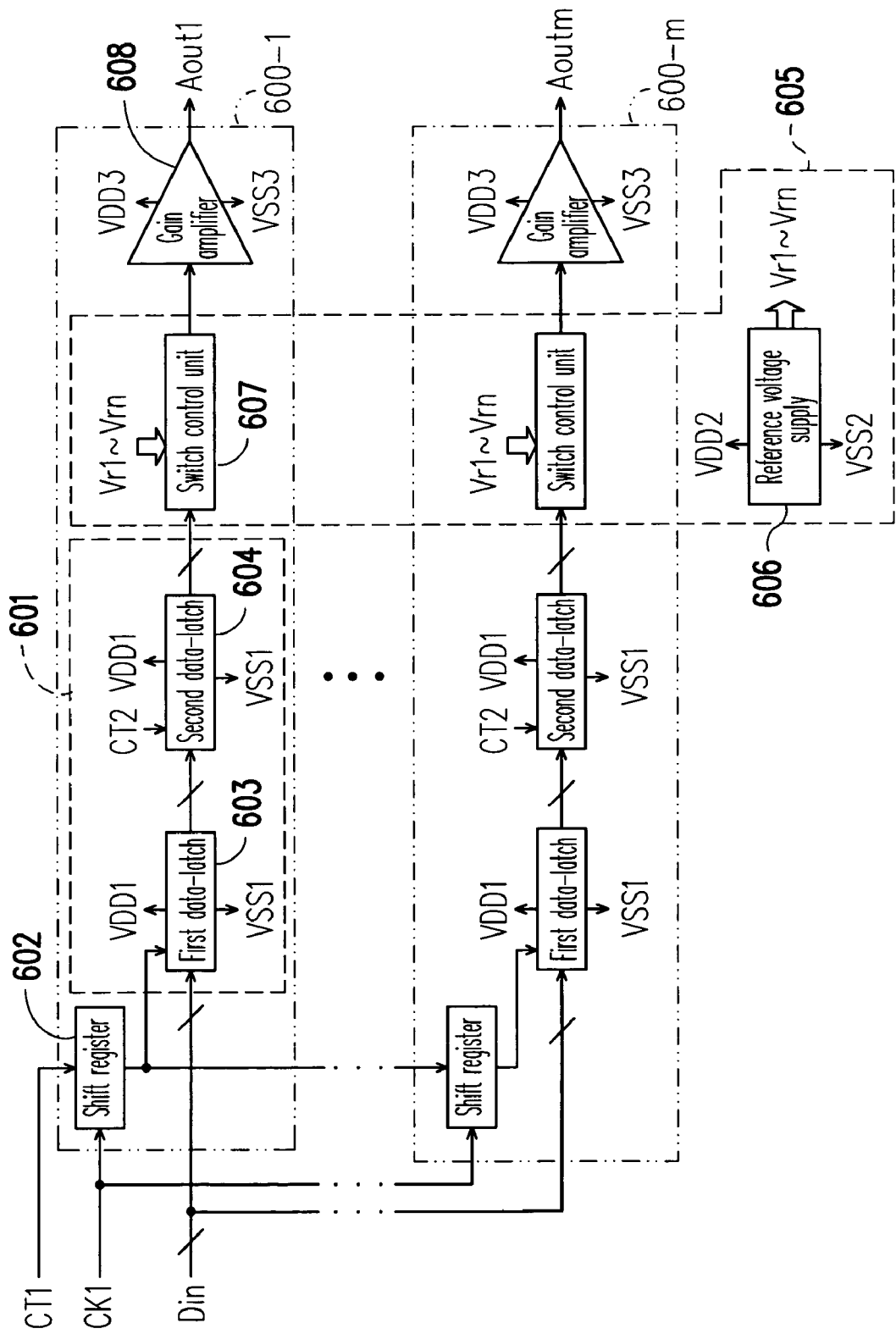
FIG. 6 is another embodiment describing a D/A conversion device according to the present invention.

FIG. 6 is another embodiment of a D/A conversion device according to the present invention. With reference to FIG. 6, a D/A conversion device with a plurality of channels is illustrated. Wherein, each of the channels is implemented with a D/A converter (i.e. 600-1~600-m) to convert the digital input data Din into the analog output data Aout1-Aoutm respectively, and to drive the corresponding loads (for example, the data channels on an LCD panel) respectively. The reference voltage supply can be shared in this architecture. The shift register receives the first control signals CT1 and outputs the shifted control signals in sequence to the corresponding first data-latch according to the first clock signal CK1. Taking the D/A conversion device 600-1 as the example, the digital input data Din is converted into the analog output data Aoutl. The D/A conversion device 600-1 includes the shift register 602, the data-latch unit 601, the D/A conversion unit 605 and the gain amplifier 608. The data-latch unit 601 includes the first data-latch 603 and the second data-latch 604. The D/A conversion unit 605 includes the reference voltage supply 606 and the switch control unit 607. The second control signal CT2 is used to control the second data-latch 604, and the first clock signal CK1 and the first control signal CT1 are used to activate the shift register 602.

Figure 3:
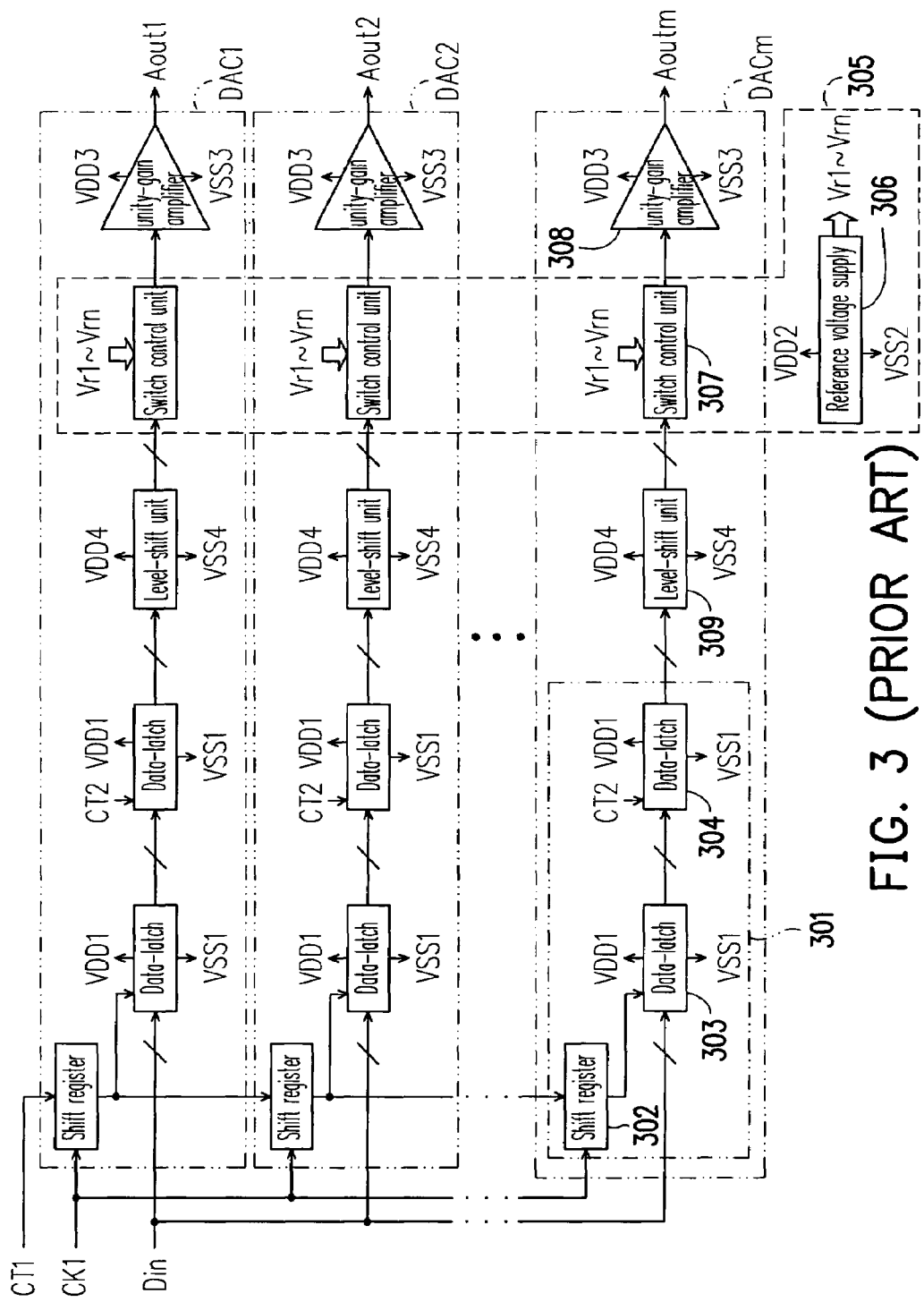
FIG. 3 schematically describes another conventional D/A conversion device.
Figure 3A:
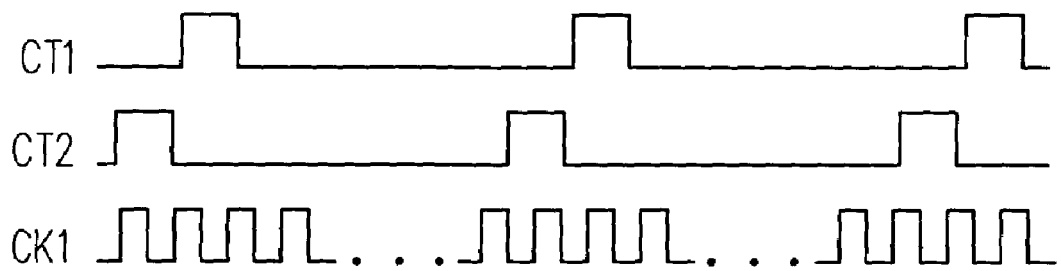
FIG. 3A schematically illustrates the timing sequence relations of the signals in FIG. 3.

In the present embodiment, the timing sequence relations of the first clock signal CK1, the first control signal CT1 and the second control signal CT2 can be implemented referring to FIG. 3A. With reference to FIG. 6 and FIG. 3A, the shift register of the D/A converter (i.e. 600-1~600-m) step-transmits the first control signal CT1 according to the timing sequence of the first clock signal CK1. Whenever the first control signal CT1 is detected as the high level by the first clock signal CK1 which is at the high level, the shift register 602 outputs a first enabling signal to the first data-latch 603. Therefore, the first digital input data Din is received and latched in the first data-latch unit 603. That is, in the D/A converter (i.e. 600-1~600-m), the shift register outputs a series of enabling signals to the first data-latches according to the first clock signal CK1, and a series of digital input data Din is then received and latched in the first data-latches in sequence. When the digital input data Din in series is fully received and latched in the first data-latches, the second control signal CT2 is then transformed to a high level, and the data latched in the first data-latches is then sent to and latched into the second data-latches (for example, 604). The switch control units (for example, 607) select one of the reference voltages Vr1~Vrn outputted from the reference voltage supply 606 according to the digital codes outputted by the second data-latches (for example, 604), so as to output the analog voltage to the gain amplifier (for example, 608). The gain amplifiers amplify (to increase the voltage level) the analog voltages outputted by the corresponding switch control units, so as to output the analog output data Aout1~Aoutm, respectively.

Next, the first control signal CT1 and the clock signal CK1 are transformed into a high level again, therefore, the data in the first data-latch is updated and latched. And then the above data latch operation is repeated. The operation principle of the D/A conversion is similar to that described in FIG. 4 and FIG. 5. The main difference is that the device in FIG. 6 can latch a plurality of digital input data in the first data-latches, and the digital input data Din is received and latched by the first data-latch 603 according to the command of the shift register 602.

As shown in FIG. 6, the data-latches 603, 604 and the shift register 602 operate at the voltage VDD1 and the voltage VSS1, the reference voltage supply 606 operates at the voltage VDD2 and voltage VSS2, and the gain amplifier 608 operates at the voltage VDD3 and voltage VSS3. During the conversion operation, since the third voltage VDD2≦the first voltage VDD1≦the fifth voltage VDD3, and the sixth VSS3≦the second voltage VSS1≦the fourth voltage VSS2, therefore, the level-shifters are not required. Thus, the D/A conversion device in FIG. 6 requires the gain amplifier 608 to achieve the voltage gain.

To sum up, since the present invention makes the operation voltage of the D/A conversion unit not greater than the operation voltage of the data-latch unit, therefore, the output of the data-latch unit can fully drive the D/A conversion unit without using the level-shift circuits. And then, through the gain function of the gain amplifier, the analog output data with enough voltage level can be provided for the output load. Accordingly, the present invention can save the costs of the level-shift circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A digital-to-analog (D/A) conversion device, used to covert a digital input data into an analog output data, the D/A conversion device comprising:
    a data-latch unit, having an input terminal, a first output terminal and a second output terminal, the data-latch unit is used to receive the digital input data from the input terminal and to latch the digital input data and output the latched data from the first output terminal during a second period, and to latch the digital input data and output the latched data from the second output terminal during a first period, wherein the output voltage level of the data-latch unit is between a first voltage and a second voltage;
    a first switch, the first terminal of the first switch being coupled to the first output terminal of the data-latch unit, so as to keep the first terminal and the second terminal of the first switch disconnected during the first period, and to keep the first terminal and the second terminal connected to send the latched data to the second terminal of the first switch during the second period;
    a second switch, the first terminal of the second switch being coupled to the second output terminal of the data-latch unit, so as to keep the first terminal and the second terminal of the second switch disconnected during the second period, and to keep the first terminal and the second terminal connected to send the latched data to the second terminal of the second switch during the first period;
    a D/A conversion unit, the input terminal of the D/A conversion unit being coupled to the second terminals of the first switch and the second switch, so as to receive the latched digital data outputted from the data-latch unit, and output a corresponding analog voltage from the output terminal of the D/A conversion unit, wherein the level of the analog voltage is between a third voltage and a fourth voltage; and
    a gain amplifier, the input terminal of the gain amplifier being coupled to the output terminal of the D/A conversion unit, so as to amplify the analog input voltage and generate the analog output data from the output terminal of the gain amplifier, wherein the voltage level of the analog output data is between a fifth voltage and a sixth voltage.

2. The D/A conversion device as claimed in claim 1, wherein the data-latch unit comprises:
    a first data-latch, the first terminal of the first data-latch is coupled to the input terminal of the data-latch unit to receive the digital input data, and the second terminal of the first data-latch is coupled to the first output terminal of the data-latch unit, so as to receive the digital input data during the first period, and to latch the digital input data and output the latched data from the second terminal during the second period, wherein the voltage level of the latched data is between the first voltage and the second voltage; and
    a second data-latch, the first terminal of the second data-latch is coupled to the input terminal of the data-latch unit to receive the digital input data, and the second terminal of the second data-latch is coupled to the second output terminal of the data-latch unit, so as to receive the digital input data during the second period, and to latch the digital input data and output the latched data from the second terminal during the first period, wherein the voltage level of the latched data is between the first voltage and the second voltage.

3. The D/A conversion device as claimed in claim 1, wherein the D/A conversion unit comprises:
    a reference voltage supply, the output terminal of the reference voltage supply is coupled to a first terminal of the switch control unit to provide a plurality of the reference voltages for the switch control unit, wherein the levels of the reference voltages are between the third voltage and the fourth voltage; and
    a switch control unit, a first terminal of the switch control unit is coupled to the output terminal of the reference voltage supply, and a second terminal of the switch control unit is coupled to the second terminals of the first switch and the second switch. The switch control unit is used to select one of the reference voltages according to the received latched data and output the selected analog reference voltage.

4. The D/A conversion device as claimed in claim 1, wherein the third voltage$\leq$the first voltage, the first voltage$\leq$the fifth voltage, the sixth voltage$\leq$the second voltage, and the second voltage$\leq$the fourth voltage.

5. The D/A conversion device as claimed in claim 1, wherein the voltage level of the latched data outputted by the data-latch unit is enough to drive the D/A conversion unit, and the first voltage$\leq$the fifth voltage, the sixth voltage$\leq$the second voltage.

6. A D/A conversion device, used to convert a digital input data into an analog output data, the D/A conversion device comprising:
    a data-latch unit, having an input terminal and an output terminal, the data-latch unit is used to receive the digital input data from the input terminal, and output a second latched data from the output terminal of the data-latch unit, wherein the output voltage level of the second latched data is between a first voltage and a second voltage;
    a D/A conversion unit, the input terminal of the D/A conversion unit being coupled to the output terminal of the data-latch unit, so as to receive the second latched data outputted from the data-latch unit, and output a corresponding analog voltage from the output terminal of the D/A conversion unit, wherein the level of the analog voltage is between a third voltage and a fourth voltage; and
    a gain amplifier, the input terminal of the gain amplifier being coupled to the output terminal of the D/A conversion unit, so as to amplify the analog input voltage and generate the analog output data from the output terminal of the gain amplifier, wherein the voltage level of the analog output data is between a fifth voltage and a sixth voltage.

7. The D/A conversion device as claimed in claim 6, wherein the data-latch unit comprises:
    a first data-latch, the first terminal of the first data-latch is coupled to the input terminal of the data-latch unit to receive the digital input data during a first period, and latch the digital input data and output a first latched data from the second terminal of the first data-latch during a second period, wherein the voltage level of the first latched data is between the first voltage and the second voltage; and a second data-latch, the first terminal of the second data-latch is coupled to the second terminal of the first data-latch, so as to receive the first latched data during the second period, and to latch the first latched data and output a second latched data from the second terminal of the second data-latch during the first period, wherein the voltage level of the second latched data is between the first voltage and the second voltage.

8. The D/A conversion device as claimed in claim 6, wherein the D/A conversion unit comprises:

a reference voltage supply, the output terminal of the reference voltage supply is coupled to a first terminal of the switch control unit to provide a plurality of the reference voltages for the switch control unit, wherein the levels of the reference voltages are between the third voltage and the fourth voltage; and a switch control unit, a first terminal of the switch control unit is coupled to the output terminal of the reference voltage supply, and a second terminal of the switch control unit is coupled to the output terminal of the data-latch unit; the switch unit is used to select one of the reference voltages according to the received second latched data and output the selected analog reference voltage.

9. The D/A conversion device as claimed in claim 6, wherein the third voltage≦the first voltage, the first voltage≦the fifth voltage, the sixth voltage≦the second voltage, and the second voltage≦the fourth voltage.

10. The D/A conversion device as claimed in claim 6, wherein the voltage level of the second latched data is enough to drive the D/A conversion unit, the first voltage≦the fifth voltage, and the sixth voltage≦the second voltage.

11. A D/A conversion device, used to convert digital input data into analog output data, the D/A conversion device comprising:

a shift register, a first terminal of the shift register receives a first control signal, and a second terminal is coupled to a first clock signal; the shift register is used to shift a received first control signal in sequence according to a first clock signal, so as to output at least a shifted control signal from the output terminal;

a data-latch unit, a first terminal of the data-latch unit receives the digital input data, and a second terminal of the data-latch unit is coupled to the output terminal of the shift register; the data-latch unit is used to receive and latch the digital input data according to the shifted control signal and a second control signal, so as to output a second latched data from the output terminal, wherein the voltage level of the second latched data is between a first voltage and a second voltage;

a D/A conversion unit, the input terminal of the D/A conversion unit being coupled to the output terminal of the data-latch unit, so as to receive the second latched data outputted from the data-latch unit and output a corresponding analog voltage from the output terminal, wherein the level of the analog voltage is between a third voltage and a fourth voltage; and a gain amplifier, the input terminal of the gain amplifier is coupled to the output terminal of the D/A conversion unit, so as to amplify the analog input voltage and generate the analog output data from the output terminal of the gain amplifier, wherein the voltage level of the analog output data is between a fifth voltage and a sixth voltage.

12. The D/A conversion device as claimed in claim 11, wherein the data-latch unit comprises:

a first data-latch, a first terminal of the first data-latch is coupled to the first terminal of the data-latch unit to receive the digital input data, and a second terminal of the first data-latch unit is coupled to the second terminal of the data-latch unit to receive the shifted control signal, the first data-latch receives and latches the digital input data according to the shifted control signal and outputs a first latched data from the output terminal of the first data-latch unit, wherein the voltage level of the first latched data is between the first voltage and the second voltage; and a second data-latch, the output terminal of the second data-latch is coupled to the output terminal of the data-latch unit, the first terminal of the second data-latch receives a second control signal, the second terminal of the second data-latch is coupled to the output terminal of the first data-latch, so as to receive and latch the first latched data according to a second control signal and output a second latched data from the output terminal of the second data-latch, wherein the voltage level of the second latched data is between the first voltage and the second voltage.

13. The D/A conversion device as claimed in claim 11, wherein the D/A conversion unit comprises:

a reference voltage supply, the output terminal of the reference voltage supply is coupled to a first terminal of the switch control unit to provide a plurality of the reference voltages for the switch control unit, wherein the levels of the reference voltages are between the third voltage and the fourth voltage; and a switch control unit, a first terminal of the switch control unit is coupled to the output terminal of the reference voltage supply, and a second terminal of the switch unit is coupled to the output terminal of the data-latch unit; the switch control unit is used to select one of the reference voltages according to the received second latched data and output the selected analog reference voltage.

14. The D/A conversion device as claimed in claim 11, wherein the third voltage≦the first voltage, the first voltage≦the fifth voltage, the sixth voltage≦the second voltage, and the second voltage≦the fourth voltage.

15. The D/A conversion device as claimed in claim 11, wherein the voltage level of the second latched data is enough to drive the D/A conversion unit, the first voltage≦the fifth voltage, and the sixth voltage≦the second voltage.

* * * * *